(12) United States Patent
Zou

(10) Patent No.: US 11,171,618 B2
(45) Date of Patent: Nov. 9, 2021

(54) CMOS TRANS-IMPEDANCE AMPLIFIER

(71) Applicant: AmpliPHY Technologies Limited, Hangzhou (CN)

(72) Inventor: Hehong Zou, Hangzhou (CN)

(73) Assignee: AmpliPHY Technologies Limited, Hangzhou (CN)

( * ) Notice: Subject to any disclaimer, the term of this patent is extended or adjusted under 35 U.S.C. 154(b) by 144 days.

(21) Appl. No.: 16/713,001

(22) Filed: Dec. 13, 2019

(65) Prior Publication Data

US 2021/0058045 A1    Feb. 25, 2021

(30) Foreign Application Priority Data

Aug. 22, 2019    (CN) .......................... 201910779666.4

(51) Int. Cl.
| | | |
|---|---|---|
| *H03F 3/08* | (2006.01) | |
| *H03F 3/345* | (2006.01) | |
| *H04B 10/60* | (2013.01) | |
| *H03F 3/04* | (2006.01) | |

(52) U.S. Cl.
CPC ............ *H03F 3/345* (2013.01); *H04B 10/60* (2013.01); *H03F 3/04* (2013.01); *H03F 3/08* (2013.01); *H03F 3/087* (2013.01)

(58) Field of Classification Search
CPC .... H03F 3/345; H03F 2200/408; H03F 1/342; H03F 1/086; H03F 2200/129; H03F 1/42; H03F 3/082; H03F 1/0205; H03F 3/68; H03F 3/08; H03F 3/087; H03F 3/085; H04B 10/60; H03G 3/3084; H03G 1/0047
USPC ................................ 330/59, 308; 250/214 A
See application file for complete search history.

(56) References Cited

U.S. PATENT DOCUMENTS

| | | | |
|---|---|---|---|
| 6,566,959 B2* | 5/2003 | Ide ........................... | H03F 1/301 330/288 |
| 10,171,040 B1* | 1/2019 | Zou ...................... | H03G 1/0029 |
| 10,367,454 B2* | 7/2019 | Zou .......................... | H03F 3/082 |

\* cited by examiner

*Primary Examiner* — Khanh V Nguyen
(74) *Attorney, Agent, or Firm* — Bayramoglu Law Offices LLC

(57) ABSTRACT

A CMOS trans-impedance amplifier includes an inverting amplifier circuit and a feedback resistor. The inverting amplifier circuit includes an input end and an output end, and the feedback resistor is coupled therebetween. The inverting amplifier circuit includes at least three sequentially-connected amplifier units, and each amplifier unit includes at least three sequentially-connected nFETs, namely an input signal receiving part nFET, an intermediate part nFET and a DC signal receiving part nFET. A common connection terminal of the input signal receiving part nFET and the intermediate part nFET is configured to output an amplified voltage signal.

10 Claims, 3 Drawing Sheets

CMOS TRANS-IMPEDANCE AMPLIFIER

CROSS REFERENCE TO THE RELATED APPLICATIONS

This application is based upon and claims priority to Chinese Patent Application No. 201910779666.4, filed on Aug. 22, 2019, the entire contents of which are incorporated herein by reference.

TECHNICAL FIELD

This invention relates to a technical field of a complementary metal oxide semiconductor (CMOS) and, more particular, to a CMOS trans-impedance amplifier.

BACKGROUND

A trans-impedance amplifier (TIA) is a type of an amplifier, and the type of the amplifier is defined according to the types of input and output signals. Due to its high bandwidth, the TIA is generally used in high-speed circuits, such as photoelectric transmission communication systems.

In a modern high-speed optical fiber communication system, a trans-impedance amplifier is typically used to convert and amplify a weak photocurrent signal generated by a photodiode into a voltage signal and output the amplified voltage signal to the subsequent circuit for processing. Therefore, the trans-impedance amplifier is often used as a core component for a receiving end of an optical communication system, with its indexes such as noise, sensitivity and the like determining the performance of the entire receiving end. In the trans-impedance amplifier, sensitivity is an important index of the circuit performance. Further, in a dynamic range of an input to a circuit of the trans-impedance amplifier, it is defined as a difference between a saturated input optical power and the sensitivity. The sensitivity is mainly determined by an equivalent input noise, and the smaller the equivalent input noise is, the higher the sensitivity index will be, whereas the saturated input optical power is mainly determined by a pulse width distortion of an output signal and other factors. Therefore, in order to obtain a relatively high sensitivity index, it is necessary to increase the trans-impedance as much as possible under the premise of bandwidth, and the larger the trans-impedance is, the smaller the saturated input optical power will be. In addition, an output noise level of the trans-impedance amplifier is also an important index of its transmission characteristics, that is, one way to improve the performance of the trans-impedance amplifier is to effectively reduce the noise level, while the reducing the noise output can be realized by increasing the trans-impedance, and the larger the trans-impedance is, the smaller the noise will be; however, under normal circumstances, the circuit structure design of the trans-impedance amplifier and the selection of circuit elements are limited by conditions, that is to say, the output noise level can be effectively reduced by increasing the trans-impedance only under the premise of appropriate frequency response. Further, evaluation criteria for the frequency response can be expressed by a gain-bandwidth product. In order to provide a stable voltage operating point, the above effect is achieved by employing a combination of PMOS and NMOS in existing transconductance amplifiers; however, due to the limitation of PMOS operating characteristics, a $f_{Tdouble}$ of the transconductance amplifier is relatively small, which to a certain extent results in a reduction of the gain-bandwidth product, and this directly causes no further increasing of the value of transconductance and no further reducing of the output noise level of the transconductance amplifier. In addition, a power consumption for the trans-impedance amplifier is also a big problem that needs to be considered in circuit design; in the prior art, in order to improve a operating speed of an nFET in the trans-impedance amplifier, it typically tends to adopt nFETs with a relatively small size, but for this technical means, a linear regulator (LDO) is normally required to be added in the circuit to stabilize a voltage across the nFET so that the transistor can operate normally; and at this time, it will occur that although the voltage on the nFET is forced to be reduced, the total supplied voltage has not been decreased, so a current flowing through the circuit is relatively large, and furthermore the linear regulator (LDO) takes a certain proportion of the supply voltage during operations, the energy consumption of the whole circuit thus is very large.

SUMMARY

To improve the deficiencies in the prior art, this invention provides a complementary metal oxide semiconductor (CMOS) trans-impedance amplifier, wherein the CMOS trans-impedance amplifier comprises an inverting amplifier circuit having an input end and an output end, wherein the input end is configured to receive an input voltage signal, and the output end is configured to output an amplified voltage signal; wherein the inverting amplifier circuit comprises at least three sequentially-connected amplifier units, each of the amplifier units comprises at least three sequentially-connected n-channel field effect tubes (nFETs); one of the at least three nFETs is an input signal receiving part nFET configured to receive an input signal, one of the at least three nFETs is a direct current (DC) signal receiving part nFET configured to receive a DC voltage signal, and the rest of the at least three NFETs comprises at least one intermediate part nFET coupled between the input signal receiving part nFET and the DC signal receiving part nFET, the input signal receiving part nFET has a common connection terminal with one of the at least one intermediate part nFET, and the common connection terminal is configured to output a voltage signal which has been amplified; and a feedback resistor coupled between the input end of the inverting amplifier circuit and the output end of the inverting amplifier circuit.

Preferably, the inverting amplifier circuit comprises a first stage amplifier unit, a second stage amplifier unit and a third stage amplifier unit; an input end of the first stage amplifier unit is coupled with a photodiode and configured to receive the input voltage signal, and an output end of the first stage amplifier unit is configured to output a first voltage signal amplified by the first stage amplifier unit; an input end of the second stage amplifier unit is coupled with the output end of the first stage amplifier unit for receiving the first voltage signal, and an output end of the second stage amplifier unit is configured to output a second voltage signal amplified by the second stage amplifier unit; and an input end of the third stage amplifier unit is coupled with the output end of the second stage amplifier unit for receiving the second voltage signal, and an output end of the third stage amplifier unit is configured to output the amplified voltage signal amplified by the third stage amplifier unit.

Preferably, an input signal receiving part nFET of the first stage amplifier unit is a first nFET, an intermediate part nFET of the first stage amplifier unit is a second nFET, and a DC signal receiving part nFET of the first stage amplifier unit is a third nFET; a gate of the first nFET is coupled with one end of the photodiode to receive the input voltage signal, a drain of the first nFET is configured to output the first voltage signal, and a source of the first nFET is grounded; a source of the second nFET is connected to the drain of the first nFET, and a gate of the second nFET is connected to a drain of the second nFET; the drain of the second nFET and the gate of the second nFET are both connected to a source of the third nFET, and a gate of the third nFET and a drain of the third nFET are both configured to receive the DC voltage signal; and the source of the third nFET outputs and transmits the DC voltage signal to the drain of the second nFET and the gate of the second nFET.

Preferably, an input signal receiving part nFET of the second stage amplifier unit is a fourth nFET, an intermediate part nFET is a fifth nFET, and a DC signal receiving part nFET is a sixth nFET; a gate of the fourth nFET is coupled with the output end of the first stage amplifier unit to receive the first voltage signal, a drain of the fourth nFET is configured to output the second voltage signal amplified by the second stage amplifier unit, and a source of the fourth nFET is grounded; a source of the fifth nFET is connected to the drain of the fourth nFET, and a gate of the fifth nFET is connected to a drain of the fifth nFET; the drain of the fifth nFET and the gate of the fifth nFET are both connected to a source of the sixth nFET, and a gate of the sixth nFET and a drain of the sixth nFET are both configured to receive the DC voltage signal; and the source of the sixth nFET outputs and transmits the DC voltage signal to the drain of the fifth nFET and the gate of the fifth nFET.

Preferably, an input signal receiving part nFET of the third stage amplifier unit is a seventh nFET, an intermediate part nFET is an eighth nFET, and a DC signal receiving part nFET is a ninth nFET; a gate of the seventh nFET is coupled with the output end of the second stage amplifier unit to receive the second voltage signal, a drain of the seventh nFET is configured to output the amplified voltage signal amplified by the third stage amplifier unit, and a source of the seventh nFET is grounded; a source of the eighth nFET is connected to the drain of the seventh nFET, and a gate of the eighth nFET is connected to a drain of the eighth nFET; the drain of the eighth nFET and the gate of the eighth nFET are both connected to a source of the ninth nFET, and a gate of the ninth nFET and a drain of the ninth nFET are both configured to receive the DC voltage signal; and the source of the ninth nFET outputs and transmits the DC voltage signal to the drain of the eighth nFET and the gate of the eighth nFET.

Preferably, a drain of the input signal receiving part nFET of each of the amplifier units is connected to a source of the intermediate part nFET, and a drain of the intermediate part nFET is connected to a source of the DC signal receiving part nFET; one active inductor equivalent component is coupled between a gate of the intermediate part nFET and the drain of the intermediate part nFET of each of the amplifier units; and another active inductor equivalent component is coupled between a gate of the DC signal receiving part nFET of each of the amplifier units and a DC power supply.

Preferably, the active inductor equivalent components are resistors.

Preferably, the active inductor equivalent components are nFETs.

Preferably, the active inductor equivalent components are p-channel field effect tubes (pFETs).

Preferably, one nFET is coupled between an input end and an output end of each of the amplifier units; and another nFET is coupled between two ends of the feedback resistor.

The invention provides a CMOS trans-impedance amplification circuit. Compared with the prior art, at least one nFET is added in the amplifier unit of each stage, so that a proportion of the total operating voltage applied on all the nFETs in the amplifier unit in a single stage in a supply voltage is increased, while the proportion taken by the linear regulator (LDO) in the supply voltage is correspondingly reduced. Therefore, the operating voltage of the single stage amplifier unit in the invention is closer to the supply voltage compared with the prior art, thereby increasing the utilization of the supply voltage. In addition, as the proportion of the operating voltage of the LDO in the supply voltage is reduced, the power consumption made by the LDO is also reduced with the same LDO selection, and the whole power consumption of the chip of the CMOS trans-impedance amplifier in practical application will be reduced to a certain extent.

As the proportion of the entire operating voltage of the single stage amplifier unit in the supply voltage rises in the invention (i.e. in the case where the supply voltage is constant, although the operating voltage available to be utilized by the single stage amplifier unit increases, the number of nFETs in the single stage amplifier unit also increases at the same time), the voltage distributed on a single nFET is lower than that of the prior art, and the invention thus can preferentially select nFETs with a smaller process size to improve the operating speed of the nFETs. In the invention, one nFET is added in the amplifier unit of each stage, so that the gain of the CMOS trans-impedance amplification circuit can be improved to a greater extent, and the sensitivity of the whole circuit can be improved.

Additional aspects and advantages of the invention will be set forth in part in the following description, and in part will be apparent from the following description, or may be learned by the practice of the invention.

BRIEF DESCRIPTION OF THE DRAWINGS

The drawings illustrated herein are to provide a further understanding of the present invention and form a part of this application, and the schematic embodiments of the present invention and the description thereof are for explaining the present invention and are not intended to unduly limit the present invention.

100—inverting amplifier circuit; 110—first stage amplifier unit; 120—second stage amplifier unit; 130—third stage amplifier unit; and 140—photodiode.

DETAILED DESCRIPTION OF THE EMBODIMENTS

In order to make the purpose, technical scheme and advantages of the embodiments of the present invention clearer, the description of technical schemes of the embodiments of the present invention will be made clearly and completely in the following with reference to the drawings of the embodiments of the present invention. It is obvious that the described embodiments are part of the embodiments of the present invention, but not all of them. On the basis of the described embodiments of the present invention, all other embodiments obtained by the ordinary skill in the art without inventive effort are within the scope of protection of the present invention.

In addition, unless otherwise defined, technical or scientific terms used herein shall be constructed as the common meaning as understood by those ordinary skills in the field to which the present invention belongs. The words "first", "second" and the like used in the specification of the patent application and in the claims do not indicate any order, quantity or importance, but are only used to distinguish different components.

Embodiment 1

Figure 1:
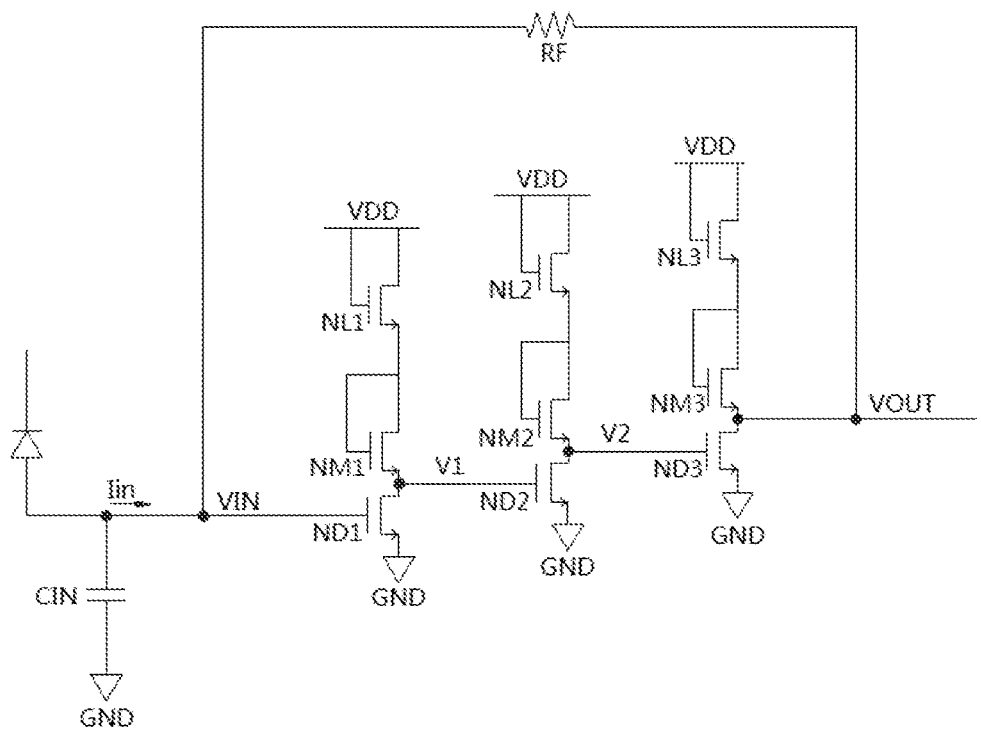
FIG. 1 is a schematic circuit structure diagram of a CMOS trans-impedance amplifier of embodiment 1 disclosed in the present invention.
Figure 2:
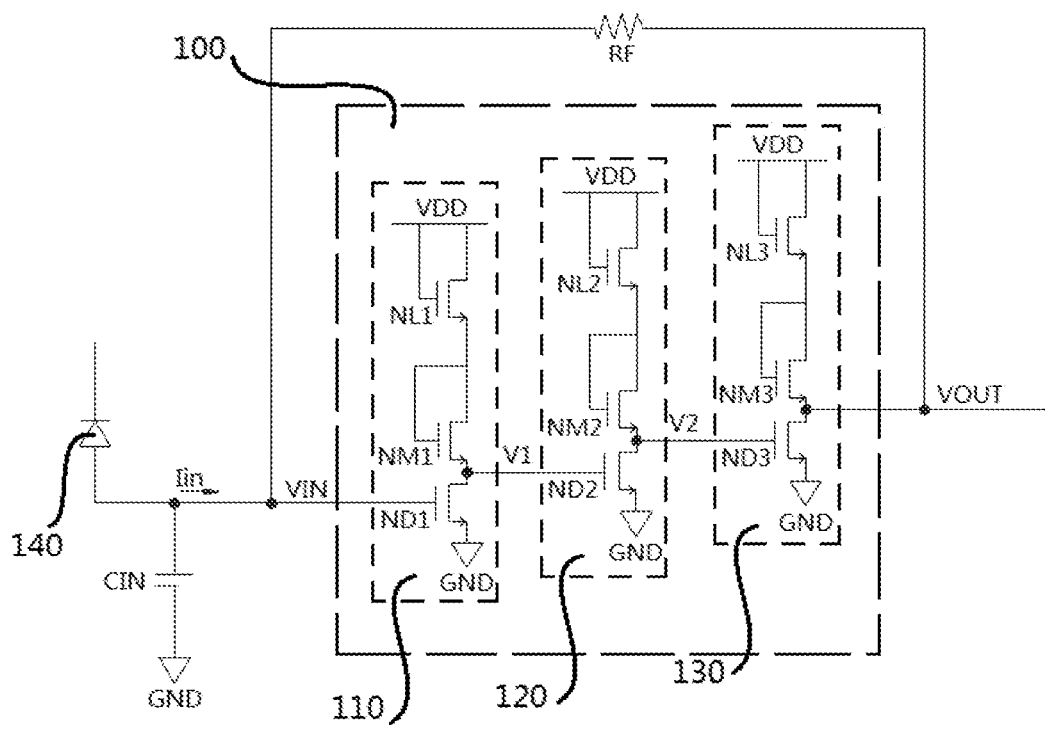
FIG. 2 is a schematic circuit structure diagram of a CMOS trans-impedance amplifier of the numbered embodiment 1 disclosed in the present invention.

FIG. 1 is a circuit structure diagram of a CMOS trans-impedance amplifier of embodiment 1 disclosed in the present invention, in which the trans-impedance amplifier disclosed in this embodiment includes an inverting amplifier circuit 100 and a feedback resistor RF connected between an input end and an output end of the inverting amplifier circuit 100. The input end of the inverting amplifier circuit 100 is configured to receive an input voltage signal, and the output end thereof is configured to output an amplified voltage signal. The inverting amplifier circuit 100 of this embodiment includes three amplifier units successively connected, but in other embodiments, it is not limited to the three amplifier units of this embodiment, and at least three or more amplifier units can be selected to implement the circuit design according to actual circuit design requirements. In this embodiment, each amplifier unit includes three nFETs coupled to each other, which are divided into an input signal receiving part nFET, an intermediate part nFET, and a DC signal receiving part nFET according to the coupled positional relationship, in which the input signal receiving part nFET is configured to receive an input voltage signal, and the DC signal receiving part nFET is configured to receive a DC voltage signal, and the intermediate part nFET is coupled to a position between the input signal receiving part nFET and the DC signal receiving part nFET, and a common connection terminal of the input signal receiving part nFET and the intermediate part nFET is configured to output the amplified voltage signal.

Specifically, a part of the inverting amplifier in circuits disclosed in this embodiment includes a first stage amplifier unit 110, a second stage amplifier unit 120, and a third stage amplifier unit 130. The first stage amplifier unit 110 includes an input end coupled to a photodiode 140 and configured to receive an input voltage signal, and an output end configured to output a first voltage signal amplified by the first amplification circuit. The second stage amplifier unit 120 includes an input end coupled with the output end of the first stage amplifier unit 110 and configured to receive the first voltage signal, and an output end configured to output a second voltage signal after a two-stage amplification. The third stage amplifier unit 130 includes an input end coupled with the output end of the second stage amplifier unit 120 and configured to receive the second voltage signal, and an output end configured to output an amplified voltage signal after a three-stage amplification.

Further, the input signal receiving part nFET of the first stage amplifier unit 110 is the first nFET, the intermediate part nFET is the second nFET, and the DC signal receiving part nFET is the third nFET. According to the structural characteristics that each nFET device has a gate, a source and a drain, this embodiment adopts the following design: the gate of the first nFET being coupled to one end of the photodiode 140 to receive the input voltage signal, the drain of the first nFET is configured to output the first voltage signal, and the source of the first nFET is grounded; the source of the second nFET is connected to the drain of the first nFET, and their common terminal is configured to output the first voltage signal; the gate of the second nFET is connected with the source of the second nFET, and the drain and gate of the second nFET are both connected to the source of the third nFET; the gate of the third nFET and the drain of the third nFET are both configured to receive a DC signal, that is to say, the source of the third nFET outputs and transmits the DC voltage signal received from the gate and drain of the third nFET to the gate and drain of the second nFET, and the gate and drain of the second nFET receive the DC voltage signal transmitted from the source of the third nFET.

The second stage amplifier unit 120 has a circuit structure similar to that of the first stage amplifier unit 110, in which the input signal receiving part nFET of the second stage amplifier unit 120 is the fourth nFET, the intermediate part nFET thereof is the fifth nFET, and the DC signal receiving part nFET thereof is the sixth nFET. The gate of the fourth nFET is coupled to the output end of the first stage amplifier unit 110 to receive the first voltage signal, the drain of the fourth nFET is configured to output a second voltage signal after a two-stage amplification, and the source of the fourth nFET is grounded; the source of the fifth nFET is connected to the drain of the fourth nFET, and their common terminal is configured to output the second voltage signal; the gate of the fifth nFET is connected to the source of the fifth nFET; the drain and gate of the fifth nFET are both connected to the source of the sixth nFET; the gate of the sixth nFET and the drain of the sixth nFET are both configured to receive a DC signal, that is to say, the source of the sixth nFET outputs and transmits the DC voltage signal received from the gate and drain of the sixth nFET to the gate and drain of the fifth nFET, and the gate and drain of the fifth nFET receive the DC voltage signal transmitted from the source of the sixth nFET.

The third stage amplifier unit 130 also has a circuit structure similar to that of the first-stage amplifier unit 110, in which the input signal receiving part nFET of the third stage amplifier unit 130 is the seventh nFET, the middle part nFET thereof is the eighth nFET, and the DC signal receiving part nFET thereof is the ninth nFET. The gate of the seventh nFET is coupled to the output end of the second stage amplifier unit 120 to receive the second voltage signal, the drain of the seventh nFET is configured to output an amplified voltage signal after a three-stage amplification, and the source of the seventh nFET is grounded; the source of the eighth nFET is connected to the drain of the seventh nFET, that is to say, their common terminal is configured to output the amplified voltage signal after a three-stage amplification; the gate of the eighth nFET is connected to the source of the eighth nFET, and the drain and gate of the eighth nFET are both connected to the source of the ninth nFET; the gate of the ninth nFET and the drain of the ninth nFET are both configured to receive a DC signal, the source of the ninth nFET thus outputs and transmits the DC voltage signal received from the gate and drain of the ninth nFET to the gate and drain of the eighth nFET, and the gate and drain of the eighth nFET receive the DC voltage signal transmitted from the source of the ninth nFET.

In this embodiment, the first stage amplifier unit 110 implements the first-stage amplification by coupling three nFETs, and the structure of three nFETs can significantly improve the gain of the first-stage amplification without affecting the bandwidth. The gain-bandwidth product refers to the product of the bandwidth of an amplifier by its corresponding gain, and is a parameter index of characterizing the performance of the amplifier; thus, without affecting the bandwidth, if the gain of the first stage amplifier unit 110 is increased, its gain-bandwidth product is also significantly increased. As the CMOC trans-impedance amplifier shown in FIG. 3, separately analyzing the circuit diagram of part of the first stage amplifier unit 110, the gain $A_{v1}$ of the first stage amplifier unit 110 can be obtained according to the structural characteristics of the circuit as follows:

$$A_{v1} = \frac{g_{mND1}}{g_{mNM1}} + \frac{g_{mND1}}{g_{mNL1}}$$

Like the first stage amplifier unit 110, the gain $A_{v2}$ of the separate circuit structure for the second stage amplifier unit 120 is:

$$A_{v2} = \frac{g_{mND2}}{g_{mNM2}} + \frac{g_{mND2}}{g_{mNL2}}$$

Likewise, the gain $A_{v3}$ of the separate circuit structure for the third stage amplifier unit 130 is:

$$A_{v3} = \frac{g_{mND3}}{g_{mNM3}} + \frac{g_{mND3}}{g_{mNL3}}$$

Therefore, the gain $A_v$ of the inverting amplifier circuit 100 with the three amplifier units successively connected is:

$$A_v = \left[g_{mND1}\left(\frac{1}{g_{mNM1}} + \frac{1}{g_{mNL1}}\right)\right] \times \left[g_{mND2}\left(\frac{1}{g_{mNM2}} + \frac{1}{g_{mNL2}}\right)\right] \times \left[g_{mND3}\left(\frac{1}{g_{mNM3}} + \frac{1}{g_{mNL3}}\right)\right]$$

wherein, $g_{mNi}$ in the above formula represents the conductance of each nFET in the circuit and it can be obtained $i \in \{D1,D2,D3,M1,M2,M3,L1,L2,L3\}$ According to the previous derivation of the formula, when compared with the prior art, the gain of the single stage amplifier unit designed in this embodiment is significantly improved, and the gain of the entire CMOS trans-impedance amplifier is also significantly improved. In addition, the inverting amplifier used in the trans-impedance amplifier disclosed in this embodiment includes three amplifier units, but more stages of amplifier units can be selected according to requirements for the circuit design in other embodiments, and at this time, the number of amplifier units increases, and the design of the circuit structure within a single amplifier unit is similar to this embodiment, and finally the gain of the entire inverting amplifier circuit 100 is the product of the gain of each amplifier unit. However, the selection of the specific number of stages of amplifier units depends on the actual situation, It is not case that the greater the number of stages of the amplifier units, the greater the gain. In addition, when the gain increases, the feedback resistance also needs to be increased if the gain bandwidth is kept unchanged, and thus the feedback resistor of the invention can be selected with a larger resistance value; and according to the theoretical relationship between a sensitivity and the feedback resistance, the input noise of the entire CMOS trans-impedance amplifier is effectively reduced with the feedback resistance increased, thus the sensitivity of the whole circuit also being increased.

In the prior art, in order to improve the operating speed of nFETs, the ones with a smaller size is usually preferred; therefore, in order to ensure the normal operation of the nFETs under a certain supply voltage, a linear regulator (LDO) is typically added to ensure that the voltage distributed to each nFET is adapted to the normal operation thereof; at this time, although it seems that the voltage applied to a single nFET is forced to be decreased, practically for the entire single stage amplifier unit the voltage applied to all nFETs and the linear regulator (LDO) within the unit originates from the supply voltage, i.e. the all current of the circuit originates from the supply voltage; however, as the size of the nFET becomes smaller which results in a larger current of the circuit, the power consumption is larger for the entire circuit.

On the contrary, on the basis of the prior art, an nFET is added in the amplifier unit of each stage, so that under a certain supply voltage, the proportion of the total operating voltage applied to the nFETs of the whole single stage amplifier unit in the supply voltage is increased and the proportion taken by the linear regulator (LDO) in the supply voltage correspondingly is reduced, due to the increase in the number of nFETs; therefore, compared with the prior art, the operating voltage of the single stage amplifier unit of the invention is closer to the supply voltage, so that the utilization of the supply voltage is increased, that is to say, the supply voltage resource can be fully utilized and the supply voltage is used for the operation of nFETs to an extreme extent, thereby reducing unnecessary energy consumption of the supply voltage. As the proportion of the operating voltage of the linear regulator (LDO) in the supply voltage is reduced, the power consumption taken by the linear regulator (LDO) is also reduced with the linear regulator (LDO) remained the same, and finally the whole power consumption of the chip of the CMOS trans-impedance amplifier in practical application is reduced to a certain extent. In addition, as with the same supply voltage, although the operating voltage available to be utilized by the single stage amplifier unit increases, the number of nFETs in the single stage amplifier unit also increases, the voltage distributed on a single nFET is lower than that of the prior art, and the invention thus can preferentially select nFETs with a smaller process dimension to improve the operating speed of the nFETs.

The single stage amplifier unit of this embodiment adopts three nFETs coupled to each other, but in other embodiments, four coupled nFETs can be used when the supply voltage allows, depending on actual design conditions and design requirements, but the rest of the circuit structure are the same as that of this embodiment.

Embodiment 2

Figure 3:
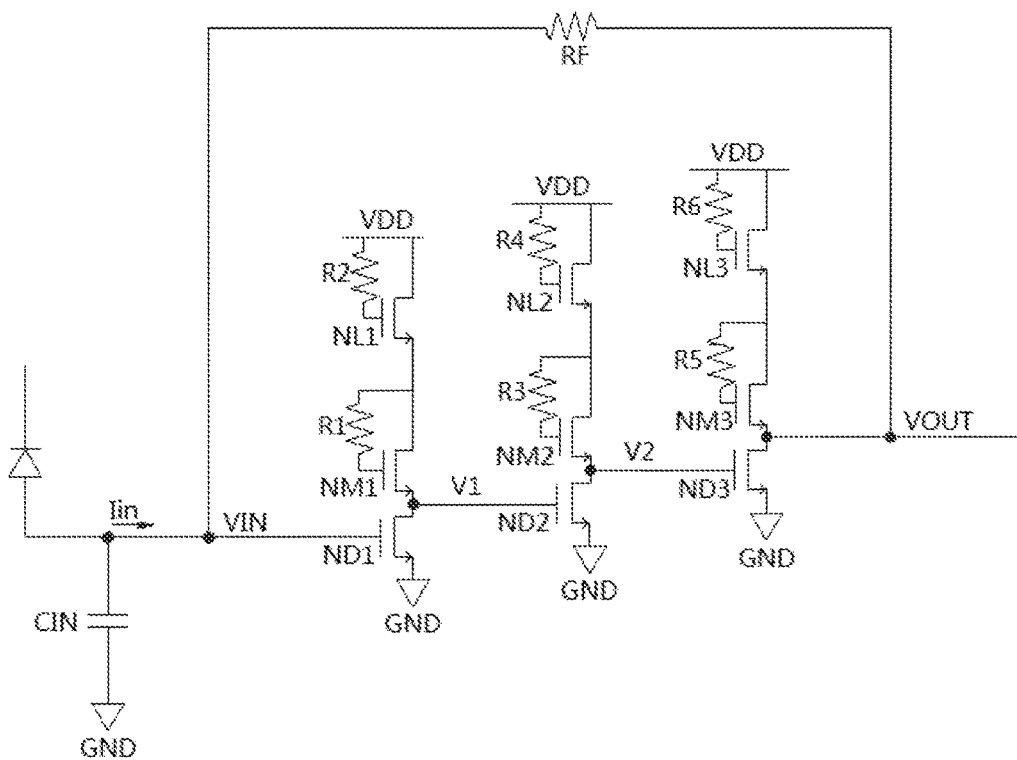
FIG. 3 is a schematic circuit structure diagram of a CMOS trans-impedance amplifier of embodiment 2 disclosed in the present invention.

FIG. 3 is a schematic circuit structure diagram of embodiment 2 of the present invention. An active inductor equivalent component is mainly added in this embodiment on the basis of the first embodiment. As shown in FIG. 3, the following circuit structure is provided: the drain of the input signal receiving part nFET of each of the amplifier units is connected to the source of the intermediate part nFET, and the drain of the intermediate part nFET is connected to the source of the DC signal receiving part nFET; and in this embodiment an active inductor equivalent component is coupled between the gate and the drain of the intermediate part nFET of each of the amplifier units, and an active inductor equivalent component is also coupled between the gate of the DC signal receiving part nFET of each of the amplifier units and a DC power supply. The active inductor equivalent device shown in FIG. 3 is replaced by a resistor, i.e., the resistor R1 connected between the gate and the source of the second nFET and the resistor R2 connected between the gate of the third nFET and the DC power supply in FIG. 3 act as active inductors, so that the bandwidth of the amplifier unit can be increased, thereby increasing the gain-bandwidth product. The resistors R3 and R4 in the second stage amplifier unit 120 and the resistors R5 and R6 in the third stage amplifier unit 130 have the same function as the resistors in the first stage amplifier unit 110, and will not be described in detail here. Therefore, adding an active inductor equivalent device can increase the gain-bandwidth product of the entire CMOS trans-impedance amplifier.

Embodiment 3

Figure 4:
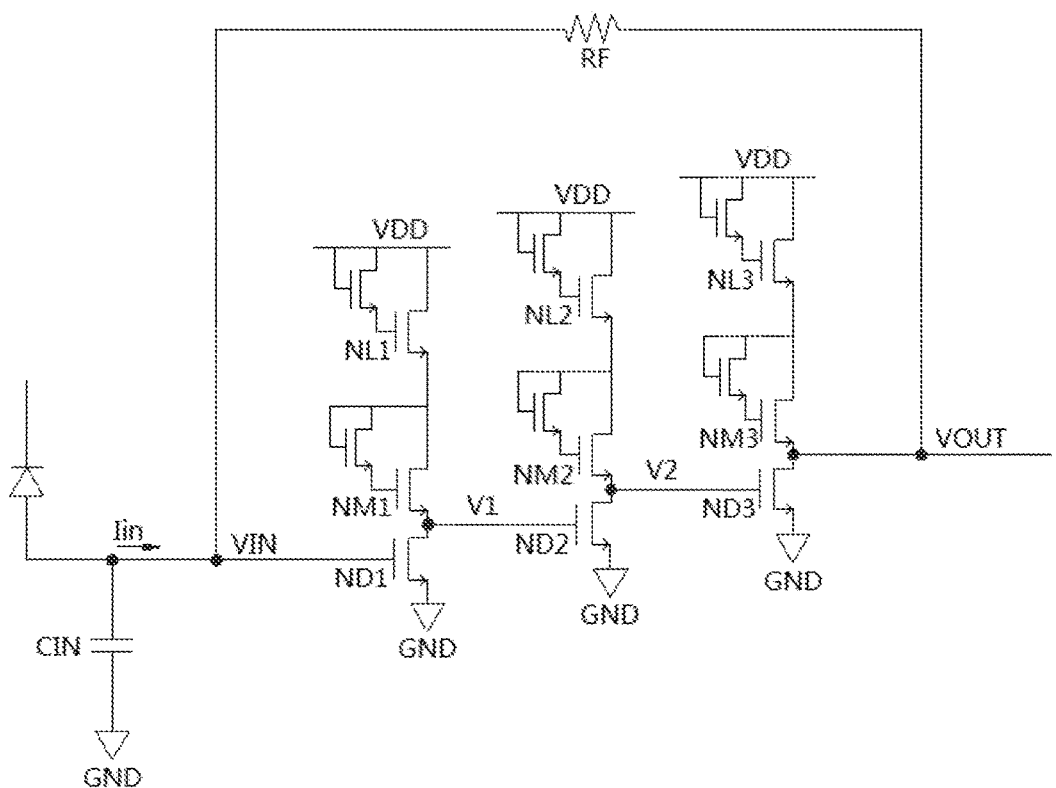
FIG. 4 is a schematic circuit structure diagram of a CMOS trans-impedance amplifier of embodiment 3 disclosed in the present invention.

FIG. 4 is a schematic circuit structure diagram of embodiment 3 of the present invention. In this embodiment, the active inductor equivalent component in embodiment 2 is replaced from a resistor to a coupled nFET with the rest of the circuit structure being the same as that in embodiment 2, and the advantages of embodiments 1 and 2 described above thus can be realized while effectively reducing the noise. In other embodiments, the active inductor equivalent component can also be a pFET, which differs from embodiment 3 in that the circuit connecting mode needs to be based on the device structure of the pFET, and other designs are the same as embodiment 3, so it will not be described in detail.

Example 4

Figure 5:
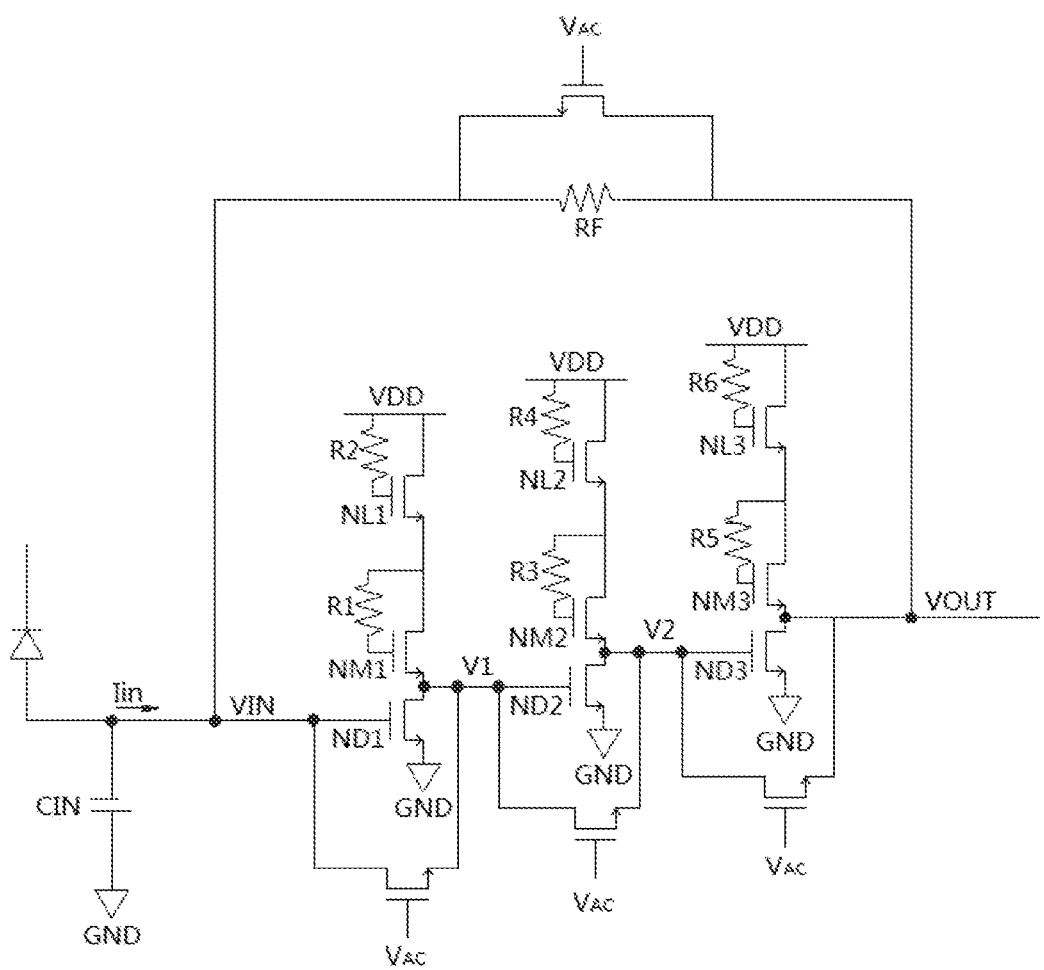
FIG. 5 is a schematic circuit structure diagram of a CMOS trans-impedance amplifier of embodiment 4 disclosed in the present invention.

FIG. 5 is a schematic circuit structure diagram of embodiment 4 of the present invention; and in this embodiment, an nFET whose gate receives alternating current voltage signals is coupled between the input end and the output end of the amplifier unit of each stage, and an nFET which receives alternating current voltage signals is also connected in parallel at both ends of the feedback resistor, thus realizing an automatic gain control (AGC control) of the CMOS trans-impedance amplifier of the present invention.

Finally, it should be noted that the above examples are only used to illustrate the technical scheme of the present invention, not to limit it; although the present invention has been described in detail with reference to the foregoing embodiments, it should be understood by those skilled in the art that the technical scheme described in the foregoing embodiments still can be modified or some of its technical features can be replaced equivalently; however, these modifications or replacement do not cause the essence of the corresponding technical solutions to depart from the scope of the technical solutions of various embodiments of the present invention.

In short, the above description is only a preferred embodiment of the present invention, and all equivalent changes and modifications made in accordance with the scope of the patent application of the present invention shall fall within the scope of the patent application of the present invention.

What is claimed is:

1. A complementary metal oxide semiconductor (CMOS) trans-impedance amplifier, comprising:
   an inverting amplifier circuit having an input end and an output end, wherein the input end is configured to receive an input voltage signal, and the output end is configured to output an amplified voltage signal; wherein the inverting amplifier circuit comprises at least three sequentially-connected amplifier units, each of the amplifier units comprises at least three sequentially-connected n-channel field effect tubes (nFETs); a first of the at least three nFETs is an input signal receiving part nFET configured to receive the input voltage signal, a second of the at least three nFETs is a direct current (DC) signal receiving part nFET configured to receive a DC voltage signal, and rest of the at least three NFETs comprises at least one intermediate part nFET coupled between the input signal receiving part nFET and the DC signal receiving part nFET, the input signal receiving part nFET has a common connection terminal with one of the at least one intermediate part nFET, and the common connection terminal is configured to output an amplified voltage signal; and
   a feedback resistor coupled between the input end of the inverting amplifier circuit and the output end of the inverting amplifier circuit.

2. The CMOS trans-impedance amplifier according to claim 1, wherein
   the inverting amplifier circuit comprises a first stage amplifier unit, a second stage amplifier unit and a third stage amplifier unit;
   an input end of the first stage amplifier unit is coupled with a photodiode and is configured to receive the input voltage signal, and an output end of the first stage amplifier unit is configured to output a first voltage signal amplified by the first stage amplifier unit;
   an input end of the second stage amplifier unit is coupled with the output end of the first stage amplifier unit for receiving the first voltage signal, and an output end of the second stage amplifier unit is configured to output a second voltage signal amplified by the second stage amplifier unit; and
   an input end of the third stage amplifier unit is coupled with the output end of the second stage amplifier unit for receiving the second voltage signal, and an output end of the third stage amplifier unit is configured to output the amplified voltage signal amplified by the third stage amplifier unit.

3. The CMOS trans-impedance amplifier according to claim 2, wherein
   an input signal receiving part nFET of the first stage amplifier unit is a first nFET, an intermediate part nFET of the first stage amplifier unit is a second nFET, and a DC signal receiving part nFET of the first stage amplifier unit is a third nFET;
   a gate of the first nFET is coupled with one end of the photodiode to receive the input voltage signal, a drain of the first nFET is configured to output the first voltage signal, and a source of the first nFET is grounded;
   a source of the second nFET is connected to the drain of the first nFET, and a gate of the second nFET is connected to a drain of the second nFET;
   the drain of the second nFET and the gate of the second nFET are both connected to a source of the third nFET, and a gate of the third nFET and a drain of the third nFET are both configured to receive the DC voltage signal; and the source of the third nFET outputs and transmits the DC voltage signal to the drain of the second nFET and the gate of the second nFET.

4. The CMOS trans-impedance amplifier according to claim 3, wherein an input signal receiving part nFET of the second stage amplifier unit is a fourth nFET, an intermediate part nFET is a fifth nFET, and a DC signal receiving part nFET is a sixth nFET;

a gate of the fourth nFET is coupled with the output end of the first stage amplifier unit to receive the first voltage signal, a drain of the fourth nFET is configured to output the second voltage signal amplified by the second stage amplifier unit, and a source of the fourth nFET is grounded;

a source of the fifth nFET is connected to the drain of the fourth nFET, and a gate of the fifth nFET is connected to a drain of the fifth nFET;

the drain of the fifth nFET and the gate of the fifth nFET are both connected to a source of the sixth nFET, and a gate of the sixth nFET and a drain of the sixth nFET are both configured to receive the DC voltage signal; and the source of the sixth nFET outputs and transmits the DC voltage signal to the drain of the fifth nFET and the gate of the fifth nFET.

5. The CMOS trans-impedance amplifier according to claim 4, wherein an input signal receiving part nFET of the third stage amplifier unit is a seventh nFET, an intermediate part nFET is an eighth nFET, and a DC signal receiving part nFET is a ninth nFET;

a gate of the seventh nFET is coupled with the output end of the second stage amplifier unit to receive the second voltage signal, a drain of the seventh nFET is configured to output the amplified voltage signal amplified by the third stage amplifier unit, and a source of the seventh nFET is grounded;

a source of the eighth nFET is connected to the drain of the seventh nFET, and a gate of the eighth nFET is connected to a drain of the eighth nFET;

the drain of the eighth nFET and the gate of the eighth nFET are both connected to a source of the ninth nFET, and a gate of the ninth nFET and a drain of the ninth nFET are both configured to receive the DC voltage signal; and the source of the ninth nFET outputs and transmits the DC voltage signal to the drain of the eighth nFET and the gate of the eighth nFET.

6. The CMOS trans-impedance amplifier according to claim 1, wherein a drain of the input signal receiving part nFET of each of the amplifier units is connected to a source of the intermediate part nFET, and a drain of the intermediate part nFET is connected to a source of the DC signal receiving part nFET;

one active inductor equivalent component is coupled between a gate of the intermediate part nFET and the drain of the intermediate part nFET of each of the amplifier units; and another active inductor equivalent component is coupled between a gate of the DC signal receiving part nFET of each of the amplifier units and a DC power supply.

7. The CMOS trans-impedance amplifier according to claim 6, wherein the active inductor equivalent components are resistors.

8. The CMOS trans-impedance amplifier according to claim 6, wherein the active inductor equivalent components are nFETs.

9. The CMOS trans-impedance amplifier according to claim 6, wherein the active inductor equivalent components are p-channel field effect tubes (pFETs).

10. The CMOS trans-impedance amplifier according to claim 1, wherein one nFET is coupled between an input end and an output end of each of the amplifier units; and another nFET is coupled between two ends of the feedback resistor.

* * * * *